(12) United States Patent
Zheng et al.

(10) Patent No.: US 10,115,335 B2
(45) Date of Patent: Oct. 30, 2018

(54) SHIFT REGISTER UNIT AND DRIVING METHOD THEREOF, GATE DRIVING CIRCUIT AND DISPLAY DEVICE

(71) Applicant: BOE TECHNOLOGY GROUP CO., LTD., Beijing (CN)

(72) Inventors: Haoliang Zheng, Beijing (CN); Seungwoo Han, Beijing (CN); Guangliang Shang, Beijing (CN); Hyunsic Choi, Beijing (CN); Mingfu Han, Beijing (CN); Xing Yao, Beijing (CN); Zhichong Wang, Beijing (CN); Lijun Yuan, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/502,983

(22) PCT Filed: May 19, 2016

(86) PCT No.: PCT/CN2016/082605
§ 371 (c)(1),
(2) Date: Feb. 9, 2017

(87) PCT Pub. No.: WO2017/143675
PCT Pub. Date: Aug. 31, 2017

(65) Prior Publication Data
US 2018/0108289 A1    Apr. 19, 2018

(30) Foreign Application Priority Data

Feb. 26, 2016 (CN) .......................... 2016 1 0109442

(51) Int. Cl.
*G11C 19/00* (2006.01)
*G09G 3/20* (2006.01)
*G11C 19/28* (2006.01)

(52) U.S. Cl.
CPC ........... *G09G 3/2092* (2013.01); *G11C 19/28* (2013.01); *G09G 2300/0408* (2013.01);
(Continued)

(58) Field of Classification Search
None
See application file for complete search history.

(56) References Cited

U.S. PATENT DOCUMENTS 9,779,680 B2 * 10/2017 Hao .................. G09G 3/3677
2010/0201659 A1    8/2010 Miyake et al.
(Continued)

FOREIGN PATENT DOCUMENTS

CN    102708818 A    10/2012
CN    103761937 A    4/2014
(Continued)

OTHER PUBLICATIONS

International Search Report and Written Opinion in PCT/CN2016/082605 dated Sep. 27, 2016, with English translation. 17 pages.
(Continued)

*Primary Examiner* — Long Nguyen
(74) *Attorney, Agent, or Firm* — Womble Bond Dickinson (US) LLP

(57) ABSTRACT

The present disclosure relates to a shift register unit and driving method thereof, a gate driving circuit and a display device. The shift register unit comprises: an input module for controlling a level of a first node based on a scan pulse, an output module for controlling a scan pulse output based on the level of the first node, a reset module for resetting the first node and the scan pulse output, and a control module for generating a reset trigger signal, wherein the reset module further resets the first node based on the reset trigger signal. The shift register units can be cascaded to form a gate driving circuit to realize output of multiple scan pulses. By
(Continued)

integrating such a gate driving circuit on the array substrate, area of the bezel region of the array substrate can be reduced, thereby facilitating bezel narrowing of a display device. At the same time, due to presence of the control module, the reset module is enabled to reset the first node more stably while normal output of the scan pulse is maintained.

20 Claims, 7 Drawing Sheets

(52) U.S. Cl.
CPC ............... *G09G 2300/0871* (2013.01); *G09G 2310/0286* (2013.01); *G09G 2310/061* (2013.01); *G09G 2310/08* (2013.01); *G09G 2320/02* (2013.01)

(56) References Cited

U.S. PATENT DOCUMENTS

| 2011/0057926 A1* | 3/2011 | Shang | ............... G09G 3/3677 345/213 |
|---|---|---|---|
| 2013/0249876 A1 | 9/2013 | Huang et al. | |
| 2014/0072093 A1 | 3/2014 | Shang et al. | |
| 2015/0262703 A1 | 9/2015 | Murakami et al. | |
| 2016/0140922 A1 | 5/2016 | Dai et al. | |
| 2016/0246418 A1 | 8/2016 | Wang et al. | |

FOREIGN PATENT DOCUMENTS

| CN | 104217763 A | 12/2014 |
|---|---|---|
| CN | 104252853 A | 12/2014 |
| CN | 104376824 A | 2/2015 |
| CN | 105047228 A | 11/2015 |
| CN | 105096902 A | 11/2015 |
| CN | 105575315 A | 5/2016 |
| JP | 2015-064585 A | 4/2015 |
| KR | 20140137646 A | 12/2014 |
| TW | 201340060 A | 10/2013 |

OTHER PUBLICATIONS

Office Action received for Chinese Patent Application No. 201610109442.9, dated Nov. 1, 2017, 9 pages (4 pages of English Translation and 5 pages of Office Action).

\* cited by examiner

SHIFT REGISTER UNIT AND DRIVING METHOD THEREOF, GATE DRIVING CIRCUIT AND DISPLAY DEVICE

RELATED APPLICATIONS

The present application is the U.S. national phase entry of PCT/CN2016/082605, with an international filling date of May 19, 2016, which claims the benefit to Chinese Patent Application No. 201610109442.9, filed on Feb. 26, 2016, the entire disclosures of which are incorporated herein by reference.

FIELD

The present disclosure relates to the field of display technologies, and particularly to a shift register unit and driving method thereof, a gate driving circuit and a display device.

BACKGROUND

With continuous development of display technologies, high resolution and narrow bezel become a development trend for display devices. In an existing display device, a gate driving circuit is implemented on an array substrate of the display device by employing a GOA (Gate Driver IC on Array, i.e. a gate driving circuit being integrated on an array substrate) technique, so that bezel narrowing is realized while maintaining display with high resolution.

A gate driving circuit that employs the GOA technology typically comprises a plurality of shift register units. During the operation of a display device, it is desired to improve the operation stability of the shift register unit so as to enhance display quality.

SUMMARY

Embodiments of the present disclosure provide a shift register unit and driving method thereof, a gate driving circuit and a display device.

According to a first aspect, embodiments of the present disclosure provide a shift register unit. The shift register unit comprises an input module, an output module, a reset module and a control module. The input module is connected to a scan pulse input and a first node, and adapted to control a level of the first node based on a scan pulse inputted on the scan pulse input. The output module is connected to a first clock signal input, the first node and a scan pulse output, and adapted to selectively set the scan pulse output at a level of a clock signal inputted on the first clock signal input based on the level of the first node. The reset module is connected to a first reset control signal input and the first node, and adapted to reset the first node and the scan pulse output based on a level of the first reset control signal input. The control module is connected to the first node, the first clock signal input, a second clock signal input, a third clock signal input and the reset module, and adapted to, when the first node is at a second level, generate a reset trigger signal based on relative level relation(s) among clock signals of the first clock signal input, the second clock signal input and the third clock signal input. The reset module is further adapted to reset the first node based on the reset trigger signal.

In some embodiments, the input module is adapted to set the first node at a first level when the scan pulse input is at the first level.

In some embodiments, the reset module comprises a first reset module, a second reset module and a first reconfiguration module. The first reset module is adapted to set the first node at the second level when the first reset control signal input is at the first level. The second reset module is adapted to set the first node at the second level when the second node is at the first level. The first reconfiguration module is adapted to set the scan pulse output at the second level when the first reset control signal input is at the first level.

In some embodiments, the control module comprises a first control module and a second control module. The first control module is adapted to set the second node at the second level when the first node is at the first level; set the second node at the first level when the first node is at the second level, a third node is at the first level and a clock signal inputted on the second clock signal input is at the first level. The second control module is adapted to set the third node at the first level when the clock signal inputted on the first clock signal input is at the first level and a clock signal inputted on the third clock signal input is at the second level; set the third node at the second level when the clock signal inputted on the first clock signal input is at the second level and the clock signal inputted on the third clock signal input is at the first level; maintain a voltage difference between the third node and the second node when the clock signal inputted on the first clock signal input is at the second level and the clock signal inputted on the third clock signal input is at the second level.

Optionally, the first level is a high level and the second level is a low level.

Optionally, the second control module comprises a first transistor, a second transistor, and a first capacitor; a first end of the first capacitor is connected to the third node, a second end thereof is connected to the second node; wherein a gate of the first transistor is connected to the first clock signal input, one of a source and a drain thereof is connected to the first clock signal input and the other is connected to the third node; a gate of the second transistor is connected to the third clock signal input, one of a source and a drain thereof is connected to the third node and the other is connected to a DC (direct current) voltage terminal for supplying a DC voltage of the second level; turn-on levels of the first transistor and the second transistor are both the first level.

Optionally, the first control module comprises a third transistor, a fourth transistor, and a fifth transistor; a gate of the third transistor is connected to the third node, one of a source and a drain thereof is connected to the second clock signal input and the other is connected to the second node; for both the fourth transistor and the fifth transistor, one of a source and a drain is connected to the second node and the other is connected to the DC voltage terminal, a gate of the fourth transistor is connected to the scan pulse input, a gate of the fifth transistor is connected to the first node; turn-on levels of the third transistor, the fourth transistor and the fifth transistor are all the first level.

Optionally, the second reset module comprises a sixth transistor, a gate of the sixth transistor is connected to the second node, one of a source and a drain thereof is connected to the first node and the other is connected to the DC voltage terminal; a turn-on level thereof is the first level.

Optionally, the shift register unit further comprises a third reset module adapted to set the first node at the second level when a second reset control signal input is at the first level.

Optionally, the third reset module comprises a seventh transistor, a gate of the seventh transistor is connected to the second reset control signal input, one of a source and a drain thereof is connected to the first node and the other is connected to the DC voltage terminal; a turn-on level thereof is the first level.

Optionally, the shift register unit further comprises a third control module adapted to set the second node at the second level when the first clock signal input is at the first level.

Optionally, the third control module comprises an eighth transistor, a gate of the eighth transistor is connected to the first clock signal input, one of a source and a drain thereof is connected to the second node and the other is connected to the DC voltage terminal; a turn-on level thereof is the first level.

Optionally, the input module comprises a ninth transistor, a gate and one of a source and a drain of the ninth transistor are connected to the scan pulse input, and the other of the source and the drain thereof is connected to the first node; a turn-on level thereof is the first level.

Optionally, the output module comprises a tenth transistor and a second capacitor; one of a source and a drain of the tenth transistor is connected to the first clock signal input and the other is connected to the scan pulse output, a gate thereof is connected to the first node, a turn-on level thereof is the first level; one end of the second capacitor is connected to the first node, the other end thereof is connected to the scan pulse output.

Optionally, the shift register unit further comprises at least one of the following reconfiguration modules: a second reconfiguration module adapted to set the scan pulse output at the second level when the second node is at a first level; a third reconfiguration module adapted to set the scan pulse output at the second level when the clock signal inputted on the second clock signal input is at the first level; a fourth reconfiguration module adapted to set the scan pulse output at the second level when the clock signal inputted on the third clock signal input is at the first level; and a fifth reconfiguration module adapted to set the scan pulse output at the second level when a clock signal inputted on a fourth clock signal input is at the first level.

Optionally, the first reconfiguration module comprises an eleventh transistor, one of a source and a drain of the eleventh transistor is connected to the scan pulse output and the other is connected to the DC voltage terminal, a gate of the eleventh transistor is connected to the first reset control signal input, and a turn-on level thereof is the first level.

Optionally, the second reconfiguration module comprises a twelfth transistor; one of a source and a drain of the twelfth transistor is connected to the scan pulse output and the other is connected to the DC voltage terminal, a gate of the twelfth transistor is connected to the second node, and a turn-on level is the first level.

Optionally, the third reconfiguration module comprises a thirteenth transistor; one of a source and a drain of the thirteenth transistor is connected to the scan pulse output and the other is connected to a DC voltage terminal, a gate of the thirteenth transistor is connected to the second clock signal input, and a turn-on level thereof is the first level.

Optionally, the fourth reconfiguration module comprises a fourteenth transistor, one of a source and a drain of the fourteenth transistor is connected to the scan pulse output and the other is connected to a DC voltage terminal, a gate of the fourteenth transistor is connected to the third clock signal input, and a turn-on level thereof is the first level.

Optionally, the fifth reconfiguration module comprises a fifteenth transistor; one of a source and a drain of the fifteenth transistor is connected to the scan pulse output and the other is connected to the DC voltage terminal, a gate of the fifteenth transistor is connected to the fourth clock signal input, and a turn-on level is the first level.

Optionally, the first reset module comprises a sixteenth transistor; a gate of the sixteenth transistor is connected to the first reset control signal input, one of a source and a drain thereof is connected to the first node and the other is connected to the DC voltage terminal, and a turn-on level thereof is the first level.

According to a second aspect, the present disclosure further provides a method of driving the shift register unit described above. The method comprises: inputting a scan pulse at a scan pulse input; and inputting a first clock signal at a first clock signal input, inputting a second clock signal at a second clock signal input, inputting a third clock signal at a third clock signal input. The voltage of the scan pulse is at the first level. The widths of the first levels within each clock period in the first clock signal, the second clock signal and the third clock signal are all identical with width of the scan pulse. The first levels in the first clock signal, the second clock signal and the third clock signal have a same duty cycle. The first levels in respective clock signals do not overlap one another and do not overlap the scan pulse. The first level in the first clock signal, the first level in the second clock signal, and the first level in the third clock signal are outputted successively. A starting time of one of the first levels in the first clock signal coincides with an ending time of the scan pulse.

According to a third aspect, the present disclosure further provides a gate driving circuit, comprising a plurality of cascaded shift register units. The shift register unit is a shift register unit described above. In two adjacent stages of shift register units, a scan pulse output of a previous stage shift register unit is connected to a scan pulse input of a subsequent stage shift register unit.

Optionally, a first reset control signal input of a previous stage shift register unit is connected to a scan pulse output of a subsequent stage shift register unit.

According to a fourth aspect, the present disclosure provides a display device, comprising a display panel and the gate driving circuit described above. The gate driving circuit is used for outputting a gate scan signal to the display panel.

The shift register units provided according to embodiments of the present disclosure may be cascaded to form a gate driving circuit to implement output of multiple scan pulses. By integrating such a gate driving circuit on the array substrate of a display device, area of a bezel region of the array substrate can be reduced, which facilitates bezel narrowing for the display device. At the same time, due to the presence of the second control module, the level of the second node can be controlled more stably when the first control module needs to be reset, while the scan pulse is outputted normally.

BRIEF DESCRIPTION OF THE DRAWINGS

The features and advantages of the present disclosure would be understood more clearly by reference to the drawings. The drawings are schematic and should not be construed as limiting the present disclosure. In the drawings.

DETAILED DESCRIPTION

To understand the above objective, features and advantages of the present disclosure more clearly, the present disclosure will be described below in further detail with reference to the accompanying drawings and detailed description. It is to be noted that embodiments of the present disclosure and features of embodiments may be combined with one another in a manner desirable for any given or particular application, unless otherwise specified.

In the description below, numerous specific details are set forth in order to provide a thorough understanding of the present disclosure. However, the present disclosure may also be implemented in other manners different from those described herein. Thus, the scope of the present invention is not limited by specific embodiments disclosed below.

Figure 1:
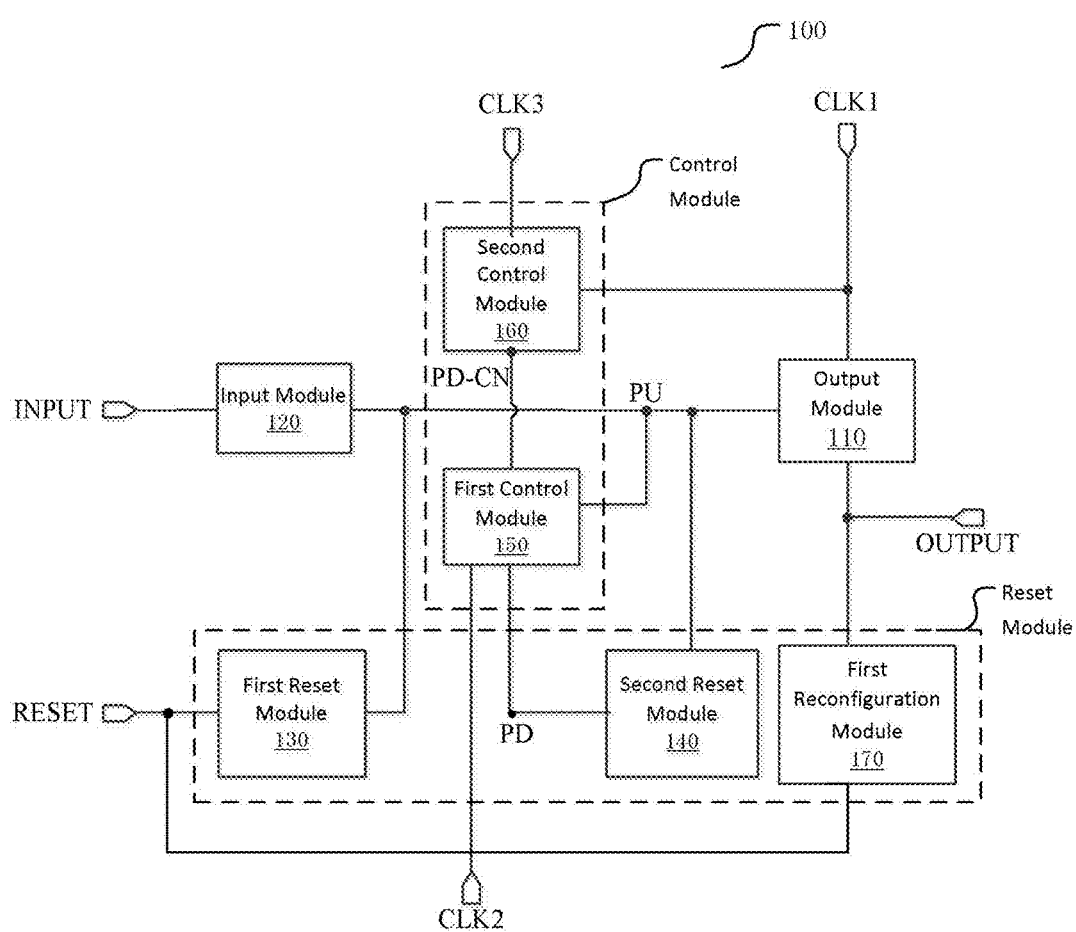
FIG. 1 shows a structural schematic diagram of a shift register unit according to embodiments of the present disclosure.

FIG. 1 shows a shift register unit 100 according to embodiments of the present disclosure. As shown in FIG. 1, the shift register unit 100 comprises an output module 110, an input module 120, a reset module, and a control module.

The output module 110 is connected to a first node PU, a first clock signal input CLK1, and a scan pulse output OUTPUT, and adapted to selectively set the scan pulse output at the level of a clock signal inputted on the first clock signal input based on the level of the first node. In one example, the output module 110 sets the scan pulse output OUTPUT at the level of the clock signal inputted on the first clock signal input CLK1 when the first node PU is at the first level.

The input module 120 is connected to the first node PU and a scan pulse input INPUT, and adapted to control the level of the first node based on a scan pulse inputted on the scan pulse input. In one example, the input module 120 sets the first node PU at the first level when the scan pulse input INPUT is at the first level.

The reset module is connected to a first reset control signal input and the first node, and adapted to reset the first node and the scan pulse output based on the level of the first reset control signal input. In one example, the reset module comprises a first reset module 130 and a second reset module 140. The first reset module 130 is connected to the first reset control signal input RESET and the first node PU, and adapted to set the first node PU at a second level when the first reset control signal input RESET is at the first level. The second reset module 140 is connected to a second node PD and the first node PU, and adapted to set the first node PU at the second level when the second node PD is at the first level.

The control module is connected to the first node, the first clock signal input, a second clock signal input, a third clock signal input and the reset module, and adapted to, when the first node is at the second level, generate a reset trigger signal based on relative level relations among clock signals of the first clock signal input, the second clock signal input and the third clock signal input. In one example, the control module comprises a first control module 150, a second control module 160, and a first reconfiguration module 170.

The first control module 150 is connected to the first node PU, the second node PD, the second clock signal input CLK2 and a third node PD-CN, and adapted to set the second node PD at the second level when the first node PU is at the first level and the third node PD-CN is at the second level, and set the second node PD at the first level when the first node PU is at the second level, the third node PD-CN is at the first level, and the clock signal of the second clock signal input CLK2 is at the first level.

The second control module 160 is connected to the third node PD-CN, the first clock signal input CLK1 and the third clock signal input CLK3, and adapted to set the third node PD-CN at the level of the clock signal inputted on the first clock signal input CLK1 when the clock signal inputted on the first clock signal input CLK1 is at the first level and the clock signal inputted on the third clock signal input CLK3 is at the second level, set the third node PD-CN at the second level when the clock signal inputted on the first clock signal input CLK1 is at the second level and the clock signal inputted on the third clock signal input CLK3 is at the first level, and maintain a voltage difference between the third node PD-CN and the second node PD when the clock signal inputted on the first clock signal input CLK1 is at the second level and the clock signal inputted on the third clock signal input CLK3 is at the first level.

The first reconfiguration module 170 is connected to the first reset control signal input RESET and the scan pulse output OUTPUT, and adapted to set the scan pulse output OUTPUT at the second level when the first reset control signal input RESET is at the first level.

In some embodiments, each of the respective modules described above may be implemented in various manners, some of which are described below only for example.

Figure 2:
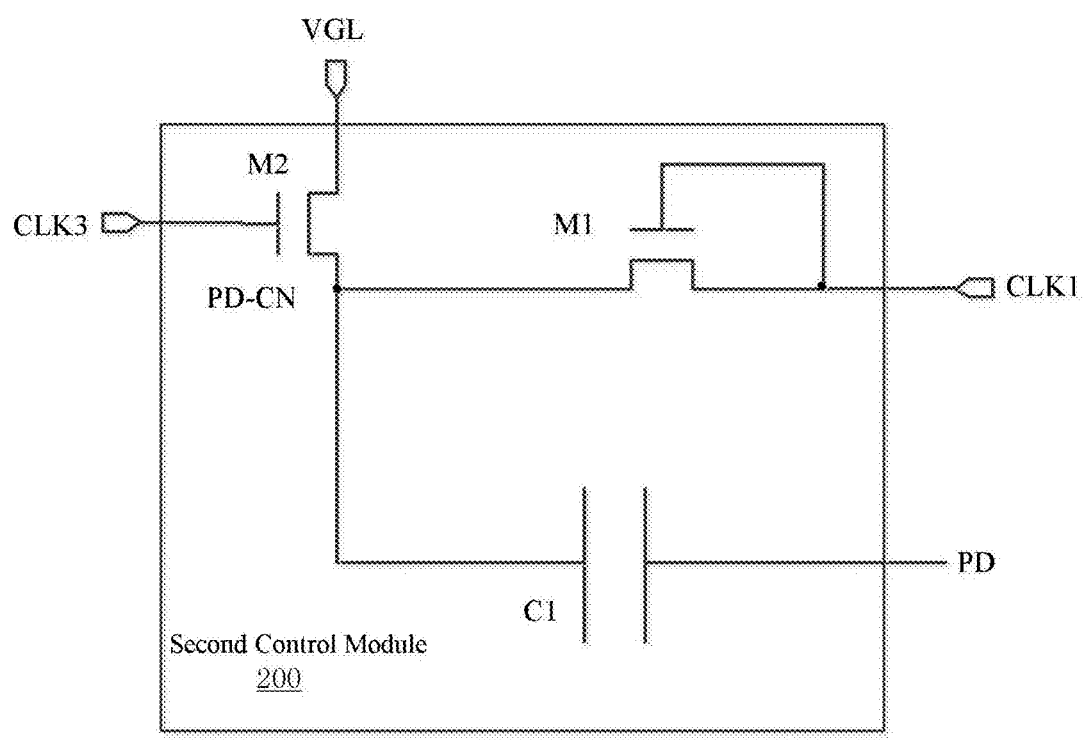
FIG. 2 shows an exemplary circuit diagram of a partial structure in a shift register unit according to embodiments of the present disclosure.

FIG. 2 shows an exemplary circuit diagram of a second control module 200 in a shift register unit according to embodiments of the present disclosure. As shown in FIG. 2, the second control module 200 may comprise a first transistor M1, a second transistor M2, and a first capacitor C1. One end of the first capacitor C1 is connected to a third node PD-CN and the other end is connected to a second node PD. The gate and one of the source and the drain of the first transistor M1 are connected to a first clock signal input CLK1, and the other of the source and the drain thereof is connected to the third node PD-CN. The gate of the second transistor M2 is connected to a third clock signal input CLK3, one of the source and the drain thereof is connected to the third node PD-CN and the other is connected to a DC voltage terminal VGL (when being applied, the DC voltage terminal VGL is generally connected to a DC voltage of the second level). The turn-on levels of the first transistor M1 and the second transistor M2 are the first level.

The operating principle of the second control module 200 is shown in FIG. 2 as follows. When the clock signal inputted on the first clock signal input CLK1 is at the first level and the third clock signal input CLK3 inputs the second level, the first transistor M1 is turned on and the second transistor M2 is turned off, such that the voltage of the third node PD-CN is set at the level of the clock signal inputted on the first clock signal input CLK1, i.e. the first level. When the clock signal inputted on the first clock signal input CLK1 is at the second level and the third clock signal input CLK3 inputs the first level, the second transistor M2 is turned on and the first transistor M1 is turned off. In this way, the third node PD-CN can be set at the second level by applying a voltage at the second level on the DC voltage terminal VGL1. When the clock signal inputted on the first clock signal input CLK1 is at the second level and the third clock signal input CLK3 inputs the second level, the PD-CN node is in a floating state. At that time, the capacitor C1 would maintain voltage difference between voltage of the PD-CN node and voltage of the PD node to be constant. In this way, the function of the second control module according to embodiments of the present disclosure is realized by means of the above structure.

It is to be understood that the specific structure of the second control module is not limited thereto. In some embodiments, those skilled in the art will be able to implement the second control module in other manners using other structures, in light of the function of the second control module as proposed herein.

Figure 3:
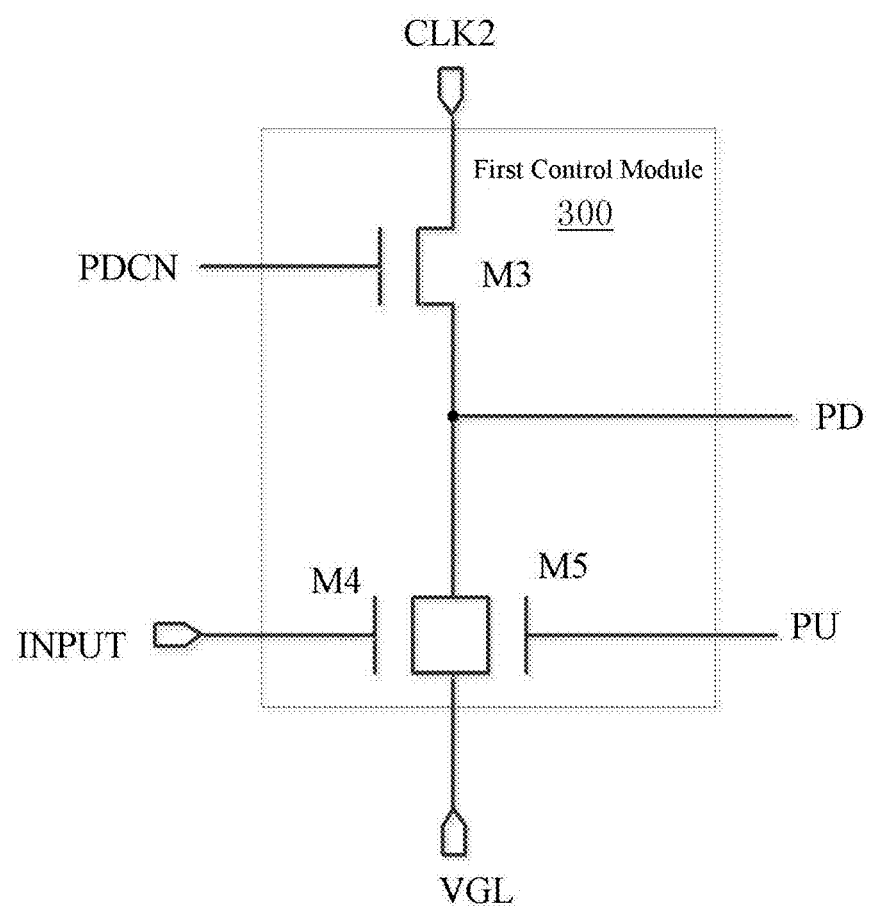
FIG. 3 shows an exemplary circuit diagram of a partial structure in a shift register unit according to embodiments of the present disclosure.

FIG. 3 shows an exemplary circuit diagram of a first control module 300 in a shift register unit according to embodiments of the present disclosure. As shown in FIG. 3, the first control module 300 may comprise a third transistor M3, a fourth transistor M4, and a fifth transistor M5. The gate of the third transistor M3 is connected to the third node PD-CN, one of the source and the drain thereof is connected to the second clock signal input CLK2, and the other is connected to the second node PD. For each of the fourth transistor M4 and the fifth transistor M5, one of the source and the drain is connected to the second node PD and the other is connected to the DC voltage terminal VGL. The gate of the fourth transistor M4 is connected to the scan pulse input INPUT. The gate of the fifth transistor M5 is connected to the first node PU. The turn-on levels of the third transistor M3, the fourth transistor M4, and the fifth transistor M5 are all the first level.

The operating principle of the first control module 300 shown in FIG. 3 is as follows. When the first node PU is at the first level, the fifth transistor M5 is turned on. When the scan pulse input INPUT is at the first level, the fourth transistor M4 is turned on. In either case, the second node PD can be connected to the DC voltage terminal VGL1, so that the voltage at the node N2 is set at the second level. When the first node PU is at the second level, the fifth transistor M5 is turned off. When the scan pulse input INPUT is at the second level, the fourth transistor M4 is also turned off. At that time, if the third node PD-CN is at the first level and then the third transistor M3 is turned on, the second clock signal input CLK2 is connected to the second node PD. At that time, if the clock signal inputted on the second clock signal input CLK2 is at the first level, the voltage of the second node PD is set at the first level. In this way, the function of the first control module according to embodiments of the present disclosure is realized by means of the above structure.

It is to be understood that implementing the fourth transistor M4 as described herein is to better ensure that the second node PD is pulled down when a scan pulse is inputted on the scan pulse input INPUT. However, the fourth transistor M4 as described herein is not necessarily to be provided for realizing the function of the first control module 300.

It is to be understood that the specific structure of the first control module is not limited thereto. In some embodiments, those skilled in the art will be able to implement the first control module in other manners using other structures in light of the function of the first control module as proposed herein.

According to embodiments of the present disclosure, in an optional structure of the second reset module, the second reset module may comprise a sixth transistor. The gate of the sixth transistor is connected to the second node PD, one of the source and the drain thereof is connected to the first node PU, and the other is connected to the DC voltage terminal VGL. The turn-on level of the sixth transistor is the first level.

In some embodiments, the input module may comprise a ninth transistor M9. The gate and one of the source and the drain of the ninth transistor M9 are connected to the scan pulse input INPUT, the other of the source and the drain thereof is connected to the first node PU, and the turn-on level thereof is the first level.

In some embodiments, the output module may comprise a tenth transistor M10 and a second capacitor C2. One of the source and the drain of the tenth transistor M10 is connected to the first clock signal input CLK1, the other is connected to the scan pulse output OUTPUT, and the gate thereof is connected to the first node PU. The turn-on level of the tenth transistor M10 is the first level. One end of the second capacitor C2 is connected to the first node PU and the other end is connected to the scan pulse output OUTPUT.

In some embodiments, the first reset module may comprise a sixteenth transistor M16. The gate of the sixteenth transistor M16 is connected to the first reset control signal input RESET, one of the source and the drain thereof is connected to the first node PU, and the other is connected to the DC voltage terminal VGL3. The sixteenth transistor M16 is turned on when the first reset control signal is inputted on the first reset control signal input RESET.

It is to be understood that the specific structures of the input module, the output module and the first reset module are not limited thereto. In some embodiments, those skilled in the art will be able to implement the input module, the output module and the first reset module in other manners using other structures in light of the respective functions of the input module, the output module and the first reset module as proposed herein.

Optionally, in some embodiments, the shift register unit may further comprise one or more of a third reset module, a third control module, a second reconfiguration module, a third reconfiguration module, a fourth reconfiguration module, and a fifth reconfiguration module.

The third reset module is connected to the first node PU, the second node PD and the second reset control signal input T-RESET, and adapted to set the first node PU at the second level when the second reset control signal input T-RESET is at the first level.

The advantage of implementing the third reset module is that the shift register units of all stages can be reset in a unified manner by applying a unified reset control signal, after all the respective shift register units have finished output of scan pulses during one frame scanning process.

In some embodiments, the third reset module may comprise a seventh transistor. The gate of the seventh transistor M7 is connected to the second reset control signal input T-RESET, one of the source and the drain thereof is connected to the first node PU, and the other is connected to the DC voltage terminal VGL. The turn-on level of the seventh transistor is the first level.

It would be understood that the third reset module here is not a structure that is necessarily implemented for achieving the basic objective of the present disclosure.

The third control module is connected to the first clock signal input CLK1 and the second node PD, and adapted to set the second node PD at the second level when the first clock signal input CLK1 is at the first level.

An advantage of such implementation is to make sure that the second reset module would not reset the first node PU when the first clock signal input CLK1 is at the first level, thereby ensuring that the shift register unit can output the scan pulse stably. Of course, in some embodiments, the third control module here is not a structure necessarily required, either.

In some embodiments, the third control module may comprise an eighth transistor M8. The gate of the eighth transistor M8 is connected to the first clock signal input CLK1, one of the source and the drain thereof is connected to the second node, and the other is connected to the DC voltage terminal VGL2. The turn-on level of the eighth transistor is the first level.

The second reconfiguration module is connected to the second node PD, the scan pulse output OUTPUT and the DC voltage terminal VGL, and adapted to set the scan pulse output OUTPUT at the second level when the second node PD is at the first level.

The third reconfiguration module is connected to the second clock signal input CLK2, the scan pulse output OUTPUT and the DC voltage terminal VGL, and adapted to set the scan pulse output at the second level when the clock signal inputted on the second clock signal input is at the first level.

The fourth reconfiguration module is connected to the third clock signal input CLK3, the scan pulse output OUTPUT and the DC voltage terminal VGL, and adapted to set the scan pulse output OUTPUT at the second level when the clock signal inputted on the third clock signal input CLK3 is at the first level.

The fifth reconfiguration module is connected to the fourth clock signal input CLK4, the scan pulse output OUTPUT, and the DC voltage terminal VGL, and adapted to set the scan pulse output OUTPUT at the second level when the clock signal inputted on the fourth clock signal input CLK4 is at the first level.

Correspondingly, an advantage of implementing the second reconfiguration module is that the scan pulse output OUTPUT can be set to the voltage on the DC voltage terminal VGL again when the second node PD is at the first level. An advantage of implementing the third reconfiguration module is that the scan pulse output OUTPUT can be reset to the voltage of the DC voltage terminal when the clock signal inputted on the second clock signal input CLK2 is at the first level. An advantage of implementing the fourth reconfiguration module is that the scan pulse output OUTPUT can be reset to the voltage of the DC voltage terminal VGL when the clock signal inputted on the third clock signal input CLK3 is at the first level. An advantage of providing the fifth reconfiguration module is that the scan pulse output OUTPUT can be reset to the voltage of the DC voltage terminal VGL when the clock signal inputted on the fourth clock signal input CLK4 is at the first level.

In some embodiments, each reconfiguration module may comprise a transistor. To facilitate discrimination, the transistor included in the first reconfiguration module is referred to as an eleventh transistor M11. One of the source and the drain of the eleventh transistor M11 is connected to the scan pulse output OUTPUT, the other is connected to the DC voltage terminal VGL, and the gate thereof is connected to the first reset control signal input RESET. The turn-on level of the eleventh transistor is the first level. The transistor included in the second reconfiguration module is referred to as a twelfth transistor M12. One of the source and the drain of the twelfth transistor M12 is connected to the scan pulse output OUTPUT, the other is connected to the DC voltage terminal VGL, and the gate thereof is connected to the second node. The turn-on level of the twelfth transistor is the first level. The transistor included in the third reconfiguration module is referred to as a thirteenth transistor. One of the source and the drain of the thirteenth transistor is connected to the scan pulse output OUTPUT, the other is connected to the DC voltage terminal VGL, and the gate thereof is connected to the second clock signal input CLK2. The turn-on level of the thirteenth transistor is the first level. The transistor included in the fourth reconfiguration module is referred to as a fourteenth transistor M14. One of the source and the drain of the fourteenth transistor M14 is connected to the scan pulse output OUTPUT, the other is connected to the DC voltage terminal VGL, and the gate thereof is connected to the third clock signal input CLK3. The turn-on level of the fourteenth transistor is the first level. The transistor included in the fifth reconfiguration module is referred to as a fifteenth transistor M15. One of the source and the drain of the fifteenth transistor is connected to the scan pulse output OUTPUT, the other is connected to the DC voltage terminal VGL, and the gate thereof is connected to the fourth clock signal input CLK4. The turn-on level of the fifteenth transistor is the first level.

It is not difficult to understand that the first level and the second level referred to in embodiments of the present disclosure are opposite levels. In some embodiments, all the first levels described above may indicate high levels and the corresponding second levels may indicate low levels. When the first level is a high level, the statement "the turn-on level of a transistor is the first level" referred to in the present disclosure may be understood as that the transistor is turned on when the difference between voltage applied to the gate of the transistor and voltage of the source thereof is higher than the turn-on threshold of the transistor.

It is to be understood that the specific structures of the respective reconfiguration modules are not limited thereto. In some embodiments, those skilled in the art will be able to implement the respective reconfiguration modules in other manners using other structures in light of the functions of the respective reconfiguration modules as proposed herein.

Figure 4:
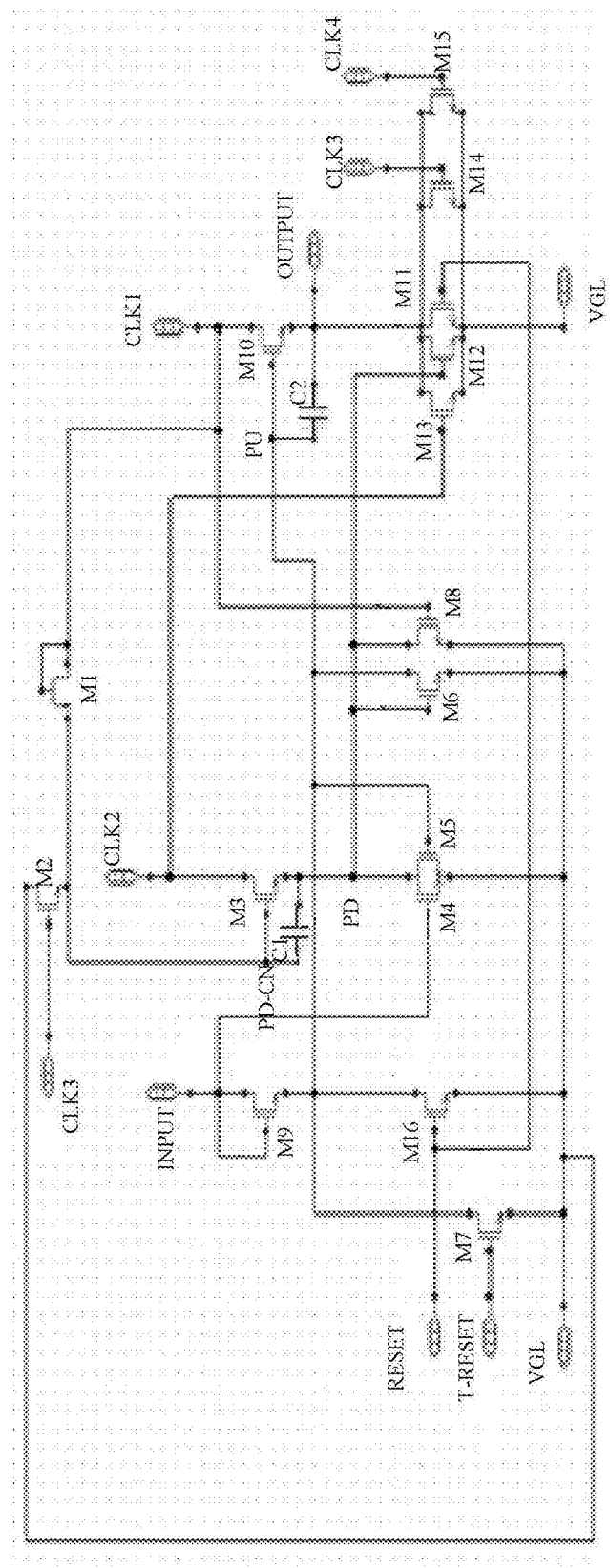
FIG. 4 shows an exemplary circuit diagram of a shift register unit according to embodiments of the present disclosure.

FIG. 4 shows an exemplary circuit diagram of a shift register unit 400 according to an embodiment of the present disclosure. As shown in FIG. 4, the shift register unit 400 may comprise sixteen N-type transistors M1 to M16, and at that time the first level described above indicates a high level and the second level is a low level. The shift register unit 400 further comprises two capacitors C1 and C2, and has a first clock signal input CLK1, a second clock signal input CLK2, a third clock signal input CLK3, a fourth clock signal input CLK4, a scan pulse input INPUT, a scan pulse output OUTPUT, a DC voltage terminal VGL, a first reset control signal input RESET and a second reset control signal input T-RESET.

The drain of the first transistor M1, the source of the second transistor M2, the gate of the third transistor M3, and the first end of the first capacitor C1 (the left end in the figure is the first end) are all connected to the third node PD-CN. The gate and the source of the first transistor M1, the source of the tenth transistor M10, and the gate of the eighth transistor M8 are all connected to the first clock signal input CLK1. The gate of the second transistor M2 and the gate of the fourteenth transistor M14 are connected to the third clock signal input CLK3. The drains of the second transistor M2, the fourth transistor M4, the fifth transistor M5, the sixth transistor M6, the seventh transistor M7, the eighth transistor M8, the eleventh transistor M11, the twelfth transistor M12, the thirteenth transistor M13, the fourteenth transistor M14 and the fifteenth transistor M15 are all connected to the DC voltage terminal VGL. The source of the third transistor M3 and the gate of the thirteenth transistor M13 are connected to the second clock signal input CLK2. The drain of the third transistor M3, the source of the fourth transistor M4, the source of the fifth transistor M5, the gate of the sixth transistor M6, the source of the eighth transistor M8, the gate of the twelfth transistor M12 and the second end (right end) of the capacitor C1 are all connected to the second node PD. The gate of the fourth transistor M4 and the source and the gate of the ninth transistor M9 are all connected to the scan pulse input INPUT. The gate of the fifth transistor M5, the source of the sixth transistor M6, the source of the seventh transistor M7, the drain of the ninth transistor M9, the gate of the tenth transistor M10, the source of the sixteenth transistor M16, the first end (left end) of the second capacitor C2 are connected to the first node PU. The source of the seventh transistor M7 is connected to the second reset control signal input T-RESET. The drain of the tenth transistor M10, the second end (right end) of the second capacitor C2, and the sources of the eleventh transistor M11, the twelfth transistor M12, the thirteenth transistor M13, the fourteenth transistor M14 and the fifteenth transistor M15 are all connected to the scan pulse input OUTPUT.

In this example, the first transistor M1, the second transistor M2, and the first capacitor C1 constitute a second control module. The third transistor M3, the fourth transistor M4, and the fifth transistor M5 constitute a first control module. The sixth transistor M6 constitutes a second reset module. The seventh transistor M7 constitutes a third reset module. The eighth transistor M8 constitutes a third control block. The ninth transistor M9 constitutes an input module. The tenth transistor M10 and the second capacitor C2 constitute an output module. The eleventh transistor M11 constitutes a first reconfiguration module. The eleventh transistor M11 constitutes a first reconfiguration module. The twelfth transistor M12 constitutes a second reconfiguration module. The thirteenth transistor M13 constitutes a third reconfiguration module. The fourteenth transistor M14 constitutes a fourth reconfiguration module. The fifteenth transistor M15 constitutes a fifth reconfiguration module. The sixteenth transistor M16 constitutes a first reset module.

Figure 5:
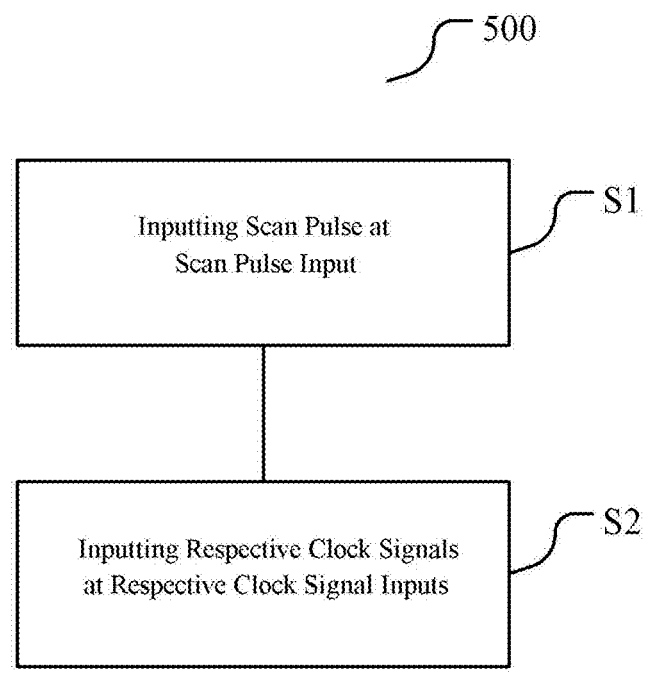
FIG. 5 shows a flow chart of a method of driving a shift register unit according to embodiments of the present disclosure.

FIG. 5 shows a flow chart of a method 500 of driving a shift register unit according to embodiments of the present disclosure. As shown in FIG. 5, the method 500 comprises the steps of:

S1: inputting a scan pulse at the scan pulse input INPUT; the voltage of the scan pulse is at the first level;

S2: inputting a first clock signal at the first clock signal input CLK1, inputting a second clock signal at the second clock signal input CLK2, and inputting a third clock signal at the third clock signal input CLK3.

The widths of the first levels within each clock period in the input first clock signal, second clock signal and third clock signal are the same as the width of the scan pulse. The first levels in the first clock signal, the second clock signal, and the third clock signal have the same duty cycle. The first levels in respective clock signals do not overlap one another and do not overlap the scan pulse (the durations in which the respective clock signals and the scan pulse are at the first level do not overlap one another). The first level in the first clock signal, the first level in the second clock signal, and the first level in the third clock signal are outputted successively. The starting time of one of the first levels in the first clock signal coincides with the ending time of the scan pulse.

In some embodiments, the first clock signal, the second clock signal, and the third clock signal can be generated by performing different phase shifts on the same clock signal.

Figure 6:
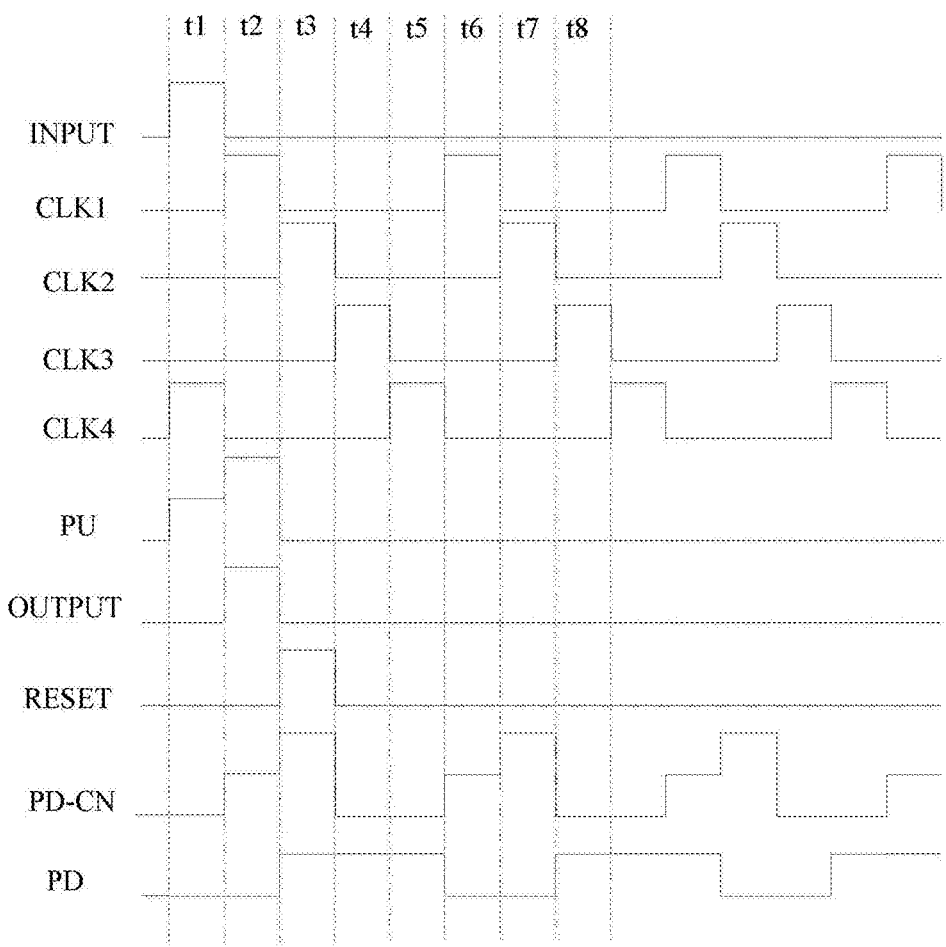
FIG. 6 shows a timing diagram of signals when the shift register unit as shown in FIG. 4 is operating.

The shift register unit according to embodiments of the present disclosure and driving method thereof will be described below in more details with reference to FIGS. 4 and 6. FIG. 6 shows a timing diagram of signals when the shift register unit 400 shown in FIG. 4 is operating.

When the shift register unit 400 in FIG. 4 is being driven, a scan pulse is inputted on the scan pulse input INPUT of the input module, and corresponding clock signals are inputted on the respective clock signal inputs respectively. As for the shift register unit 400 shown in FIG. 4, since it is connected to four clock signal inputs, four clock signals will be inputted. For the convenience of illustration, the first clock signal inputted on the first clock signal input CLK1 is also denoted as CLK1, the second clock signal inputted on the second clock signal input CLK2 is also denoted as CLK2, the third clock signal inputted on the third clock signal input CLK3 is also denoted as CLK3, and the fourth clock signal inputted on the fourth clock signal input CLK4 is also denoted as CLK4.

The high levels in the respective clock signals all have a duty cycle of one quarter. The single high levels (the width of a single high level here indicates a high level within a clock period) in the first clock signal CLK1, the second clock signal CLK2, the third clock signal CLK3 and the fourth clock signal CLK4 have identical widths, which are arranged in sequence and end to end (the "end to end" here indicates that ending time of the previous high level is starting time of the latter high level, e.g. the starting time of a high level in the first clock signal CLK1 is the ending time of a high level in the second clock signal CLK2).

The width of the scan pulse inputted on the scan pulse input INPUT coincides with the width of each of the high levels in the above respective clock signals, and its ending time is the starting time of one of the high levels in the first clock signal CLK1.

Thus, in the first phase t1, a high level is inputted on the scan pulse input INPUT, which would turn on the transistors M9 and M4. Turned-on of the transistor M9 causes the level of the first node PU to be identical with that of the scan pulse input INPUT, both of which are high levels. The first node PU is pulled up such that the transistor M10 and the transistor M5 are turned on. Turned-on of the transistor M10 makes the scan pulse output OUTPUT connected to the first clock signal input CLK1. Since the first clock signal input CLK1 is at a low level at that time, the scan pulse output OUTPUT is at a low level. Turned-on of the transistor M5 makes the second node PD is connected to the DC voltage terminal VGL. Since the DC voltage terminal VGL is at a constant low level, the second node PD is set at a low level. Turned-on of the fourth transistor M4 also makes the second node PD connected to the DC voltage terminal VGL, thereby setting the second node PD at a low level. The second node PD is at a low level, which may make the transistor M6 turned off. At the same time, in this phase, the fourth clock signal CLK4 is at a high level, which may make the transistor M15 turned on. Turned-on of the transistor M15 may further pull down the scan pulse output OUTPUT, which prevents output of a high level at that time. The second clock signal input CLK2 and the third clock signal input CLK3 are at a low level such that that the transistors M2 and M14 are both turned off. Moreover, in this phase, the first reset control signal input RESET and the second reset control signal input T-RESET are both at a low level, such that the transistors M16, M7 and M11 are all turned off. In this phase, the process of pulling up the voltage of the first node PU is completed. The transistors M5, M7 and M16 are all turned off to avoid impacting the pull-up of the voltage of the first node PU.

In the second phase t2, a low level is inputted on the scan pulse input INPUT, which may turn off the transistors M9 and M4. Moreover, in this phase, both the first reset control signal input RESET and the second reset control signal input T-RESET are at a low level such that the transistors M16, M7 and M11 are all turned off. Thus, the voltage of the first node PU is maintained at a high level. Since a high level is inputted on the first clock signal input CLK1 such that the transistor M10 continues to be turned on, the scan pulse output OUTPUT is pulled up, starting to output a high level. The pull-up of the scan pulse output OUTPUT may further increase the voltage of the first node PU, thereby better ensuring turned-on of the tenth transistor M10. The first node PU is at a high level, such that the transistor M5 continues to be turned on and the second node PD continues to be maintained at a low level VGL, thereby turning off the transistor M6 and preventing the transistor M5 from resetting the first node PU. The second node PD being at a low level makes the transistor M12 continue to be turned off, avoiding impacting output of a high level from the scan pulse output OUTPUT. In addition, since the second clock signal input CLK2, the third clock signal input CLK3, and the fourth clock signal input CLK4 are all at a low level, the transistors M13, M14 and M15 are all turned off. This phase is a scan pulse output phase, and the transistors M11, M12, M13, M14 and M15 for reconfiguring the scan pulse output OUTPUT are all turned off in order to ensure that the scan pulse output OUTPUT outputs a high level normally. Furthermore, the transistors M5, M7 and M16 that may reset the first node are all turned off. In addition, since CLK1 in this phase is at a high level, the transistor M1 is turned on, and thereby the first clock signal input CLK1 charges the third node PD-CN so that the third node PD-CN is at a high level. Since the second clock signal input CLK2 is at a low level at that time, the second node PD may not be set at a high level.

In the third phase t3, inputting a low level at the scan pulse input INPUT may turn off the transistors M9 and M4. In this phase, the first reset control signal input RESET is at a high level, so that the first node PU is pulled down, resulting in both the transistor M5 and the transistor M10 being turned off. In addition to the second clock signal input CLK2, the other clock signal inputs are all at a low level, so that the transistors M1 and M2 are both turned off. The third node PD-CN maintains a high level due to the voltage stabilization effect of the first capacitor C1, which turns on the transistor M3 and sets the second nod PD at a high level. Since the third node PD-CN is in a floating state at that time, the rise of voltage of the second node PD may cause the voltage of the third node PD-CN to jump to a higher voltage, thereby better ensuring turned-on of the third transistor M3. Thus, even if the threshold value of the transistor M3 is drifted (usually increased) due to use for a long time, it can be ensured that the transistor M3 can be turned on in the third phase t3, thereby extending the service life of the transistor M3. In addition, the second node PD being at a high level may turn on the twelfth transistor M12, thereby setting the scan pulse output OUTPUT at a low level. The first reset control signal input RESET being at a high level may further turn on the eleventh transistor M11 and also set the scan pulse output OUTPUT at a low level VGL.

In the fourth phase t4, except the third clock signal input CLK3 being at a high level, the other clock signal inputs, the first control signal input RESET, the second control signal input T-RESET, and the scan pulse input are all at a low level. This may cause the transistor M2 and the transistor M14 to be turned on. Turned-on of the transistor M2 may cause the level of the third node PD-CN to be pulled down to a low level, such that the voltage of the second node PD is maintained at a high level, the transistor M12 continues to be turned on, and the scan pulse output OUTPUT continues to be pulled down. Turned-on of the transistor M14 may also cause the scan pulse output OUTPUT to be set at a low level VGL.

In the fifth phase t5, except the fourth clock signal input CLK4 being at a high level, the other clock signal inputs, the first control signal input RESET, the second control signal input T-RESET, and the scan pulse input INPUT are all at a low level. This phase is similar to the situation of the first phase t1, except that the scan pulse input INPUT is also at a low level and may not pull up the first node PU. In this phase, the fourth clock signal input CLK4 is at a high level such that the transistor M15 is turned on, causing the scan pulse output OUTPUT to be set at a low level.

In the sixth phase t6, except the fourth clock signal input CLK1 being at a high level, the other clock signal inputs, the first control signal input RESET, the second control signal input T-RESET, and the scan pulse input are all at a low level. The situation of this phase is similar to that of the second phase t2, where the first clock signal input CLK1 charges the third node PD-CN again and pulls up the third node PD-CN. The difference is that the first node PU is at a low level and may not turn on the transistors M5 and M10.

The seventh phase t7 and subsequent phases may refer to the phases t2-t5 as described above, and will not be described in detail herein.

After a frame ends or before a frame starts, a high level pulse may be applied to the above second reset control signal input T-RESET so as to reset the first node PU for the first time.

So far, the shift register unit 400 in FIG. 4 completes the process of outputting the scan pulse. Since the voltage of the third node PD-CN jumps to a higher voltage in the phase t3, thereby ensuring better turned-on of the transistor M3, and the service life of the transistor M3 is extended. Furthermore, it is possible to realize an uninterrupted reset of the scan pulse output OUTPUT in other phases than the second phase t2 of the scan pulse output by means of the respective transistors M11, M12, M13, M14 and M15 described above. In addition, by implementing the transistor M6 and the respective transistors M3, M4, M5, M1 and M2 for controlling the turned-on of the transistor M6, the first node PU can be reset multiple times after the transistor M16 resets the first node PU, thereby avoiding charge accumulation at the first node PU (charge accumulation at the first node PU may cause turned-on of the transistor M10 to output noises). At the same time, in some embodiments, the respective transistors are all N-type transistors and can be fabricated in the same process, thereby contributing to reduction in manufacturing difficulty.

It is to be understood that, although the N-type transistor is described as an example in the above description, the present disclosure is not limited thereto. Those skilled in the art will be able to implement the shift register unit in accordance with the present disclosure using other types of transistors, such as a P-type transistor.

Figure 7:
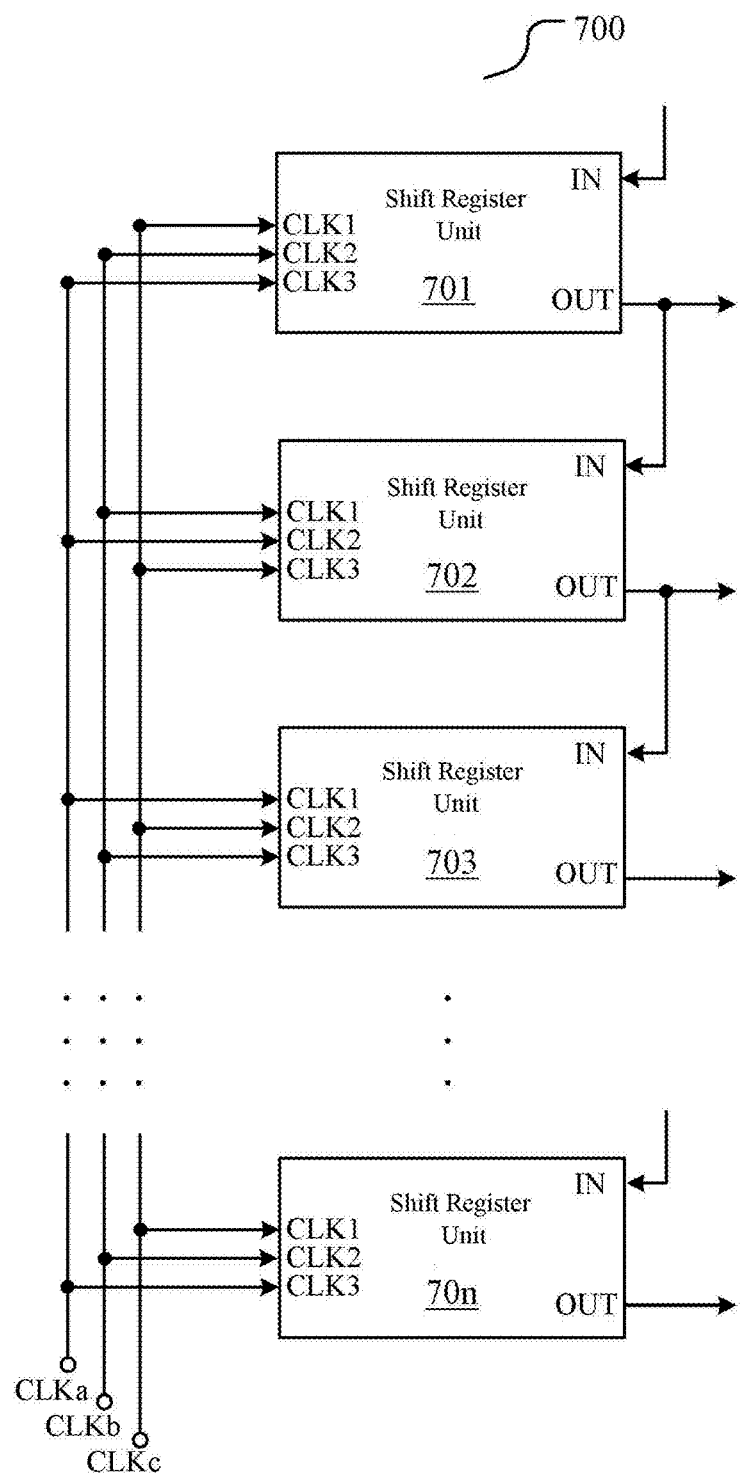
FIG. 7 shows a block diagram of a gate driving circuit according to embodiments of the present disclosure.

FIG. 7 shows a block diagram of a gate drive circuit 700 according to embodiments of the present disclosure. As shown in FIG. 7, the gate drive circuit 700 comprises multiple stages of shift register units 701, 702, 703, ..., 70n. The shift register units 701, 702, 703, ... 70n can be a shift register unit according to embodiments of the present disclosure, such as the shift registers 100 and 400 shown in FIGS. 1 and 4.

The scan pulse output of any one of the shift register units in respective stages is connected to the scan pulse input of a shift register unit in a subsequent stage. For example, the scan pulse output OUT of the shift register unit 701 is connected to the scan pulse input IN of the shift register unit 702, and the scan pulse output OUT of the shift register unit 702 is connected to the scan pulse input IN of the shift register unit 703, and so on.

The shift register unit of each stage is connected to a respective clock signal line, and each clock signal line corresponds to a clock signal input. The clock signal lines to which the shift register units of respective stages are connected may be selected from the same clock signal line group, such as the clock signal line groups CLKa, CLKb, CLKc shown in FIG. 7.

For example, for the shift register unit 400 in FIG. 4, the four clock signal lines to which the shift register units of respective stages are connected may be four identical clock signal lines. When the four clock signal lines to which the shift register units of respective stages are connected are four identical clock signal lines, for shift register units in two adjacent stages, when n is 2, 3 or 4, the n-th clock signal input for a shift register unit in a previous stage is connected to the same clock signal line as the (n−1)-th clock signal input for a shift register unit in a subsequent stage. Moreover, the first clock signal input for the shift register unit in the previous stage is connected to the same clock signal line as the fourth clock signal input for the shift register unit in the subsequent stage. In this manner, the first clock signal input for the shift register unit in the subsequent stage is at the second level when the scan pulse outputted from the shift register unit in the previous stage is outputted to the scan pulse input for the shift register unit in the subsequent stage. After the scan pulse input is at its end, the first clock signal input for the shift register unit in the subsequent stage is converted into the first level and its scan pulse output is set at the first level.

According to embodiments of the present disclosure, a plurality of shift register units may be cascaded to form a gate driving circuit so as to realize output of multiple scan pulses. By integrating such a gate driving circuit on an array substrate, area of a bezel region of the array substrate can be reduced, which facilitates bezel narrowing of the display device. At the same time, presence of a second control module allows to, on the premise of maintaining normal output of the scan pulse, level of the second node can be controlled more stably by the first control module in case reset is needed, which enables the first node to be reset more stably by the second reset module.

Figure 8:
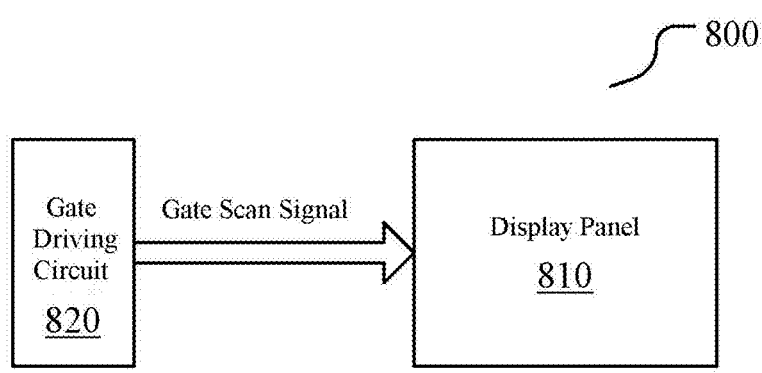
FIG. 8 shows a block diagram of a display device according to embodiments of the present disclosure.

FIG. 8 shows a block diagram of a display device 800 according to embodiments of the present disclosure. As shown in FIG. 8, the display device 800 comprises a display panel 810, and a gate driving circuit 820 according to embodiments of the present disclosure for outputting a gate scan signal to the display panel 810. The gate driving circuit may be, for example, the gate driving circuit 700 shown in FIG. 7.

In some embodiments, the display device 800 herein may be any product or component having display function, such as an electronic paper, a mobile phone, a tablet computer, a television, a display, a notebook computer, a digital photo frame, a navigator, and the like.

Although embodiments of the present disclosure have been described with reference to the accompanying drawings, those skilled in the art can make various modifications and variations without departing from the spirit and scope of the present disclosure. Such modification and variations all fall within the scope defined by the appended claims.

The invention claimed is:

1. A shift register unit, comprising:
an input module, connected to a scan pulse input and a first node, and adapted to control a level of the first node based on a scan pulse inputted on the scan pulse input;
an output module, connected to a first clock signal input, the first node and a scan pulse output, and adapted to selectively set the scan pulse output at a level of a clock signal inputted on the first clock signal input based on the level of the first node;
a reset module, connected to a first reset control signal input and the first node, and adapted to reset the first node and the scan pulse output based on a level of the first reset control signal input; and
a control module, connected to the first node, the first clock signal input, a second clock signal input, a third clock signal input and the reset module, and adapted to, when the first node is at a predefined level, generate a reset trigger signal based on a relation among levels of clock signals of the first clock signal input, the second clock signal input and the third clock signal input,
wherein the reset module is further adapted to reset the first node based on the reset trigger signal.

2. The shift register unit according to claim 1, wherein the input module is adapted to set the first node at a first level when the scan pulse input is at the first level;
the reset module comprises:
a first reset module, adapted to set the first node at a second level when the first reset control signal input is at the first level;
a second reset module, adapted to set the first node at the second level when the second node is at the first level; and
a first reconfiguration module, adapted to set the scan pulse output at the second level when the first reset control signal input is at the first level;
the control module comprises:
a first control module, adapted to set the second node at the second level when the first node is at the first level; set the second node at the first level when the first node is at the second level, a third node is at the first level and a clock signal inputted on the second clock signal input is at the first level;
a second control module, adapted to set the third node at the first level when the clock signal inputted on the first clock signal input is at the first level and a clock signal inputted on the third clock signal input is at the second level; set the third node at the second level when the clock signal inputted on the first clock signal input is at the second level and the clock signal inputted on the third clock signal input is at the first level; maintain a voltage difference between the third node and the second node when the clock signal inputted on the first clock signal input is at the second level and the clock signal inputted on the third clock signal input is at the second level.

3. The shift register unit according to claim 1, wherein the first level is a high level and the second level is a low level.

4. The shift register unit according to claim 2, wherein the second control module comprises a first transistor, a second transistor, and a first capacitor; a first end of the first capacitor is connected to the third node, a second end thereof is connected to the second node; wherein a gate of the first transistor is connected to the first clock signal input, one of a source and a drain thereof is connected to the first clock signal input and the other is connected to the third node; a gate of the second transistor is connected to the third clock signal input, one of a source and a drain thereof is connected to the third node and the other is connected to a DC voltage terminal for supplying a DC voltage of the second level; turn-on levels of the first transistor and the second transistor are both the first level.

5. The shift register unit according to claim 2, wherein the first control module comprises a third transistor, a fourth transistor, and a fifth transistor; a gate of the third transistor is connected to the third node, one of a source and a drain thereof is connected to the second clock signal input and the other is connected to the second node; for both the fourth transistor and the fifth transistor, one of a source and a drain is connected to the second node and the other is connected to the DC voltage terminal, a gate of the fourth transistor is connected to the scan pulse input, a gate of the fifth transistor is connected to the first node; turn-on levels of the third transistor, the fourth transistor and the fifth transistor are all the first level.

6. The shift register unit according to claim 2, wherein the second reset module comprises a sixth transistor, a gate of the sixth transistor is connected to the second node, one of a source and a drain thereof is connected to the first node and the other is connected to the DC voltage terminal; a turn-on level thereof is the first level.

7. The shift register unit according to claim 2, further comprising: a third reset module, adapted to set the first node at the second level when the second reset control signal input is at the first level.

8. The shift register unit according to claim 7, wherein the third reset module comprises a seventh transistor, a gate of the seventh transistor is connected to the second reset control signal input, one of a source and a drain thereof is connected to the first node and the other is connected to the DC voltage terminal; a turn-on level thereof is the first level.

9. The shift register unit according to claim 2, further comprising a third control module, adapted to set the second node at the second level when the first clock signal input is at the first level.

10. The shift register unit according to claim 9, wherein the third control module comprises an eighth transistor, a gate of the eighth transistor is connected to the first clock signal input, one of a source and a drain thereof is connected to the second node and the other is connected to the DC voltage terminal; a turn-on level thereof is the first level.

11. The shift register unit according to claim 1, wherein the input module comprises a ninth transistor, a gate and one of a source and a drain of the ninth transistor are connected to the scan pulse input, and the other of the source and the drain thereof is connected to the first node; a turn-on level thereof is the first level.

12. The shift register unit according to claim 1, wherein the output module comprises a tenth transistor and a second capacitor; one of a source and a drain of the tenth transistor is connected to the first clock signal input and the other is connected to the scan pulse output, a gate thereof is connected to the first node, a turn-on level thereof is the first level; one end of the second capacitor is connected to the first node, the other end thereof is connected to the scan pulse output.

13. The shift register unit according to claim 2, further comprising at least one of the following reconfiguration modules:
   a second reconfiguration module, adapted to set the scan pulse output at the second level when the second node is at the first level;
   a third reconfiguration module, adapted to set the scan pulse output at the second level when the clock signal inputted on the second clock signal input is at the first level;
   a fourth reconfiguration module, adapted to set the scan pulse output at the second level when the clock signal inputted on the third clock signal input is at the first level; and
   a fifth reconfiguration module, adapted to set the scan pulse output at the second level when a clock signal inputted on a fourth clock signal input is at the first level.

14. The shift register unit according to claim 13, wherein the first reconfiguration module comprises an eleventh transistor, one of a source and a drain of the eleventh transistor is connected to the scan pulse output and the other is connected to the DC voltage terminal, a gate of the eleventh transistor is connected to the first reset control signal input, a turn-on level thereof is the first level;
   the second reconfiguration module comprises a twelfth transistor; one of a source and a drain of the twelfth transistor is connected to the scan pulse output and the other is connected to the DC voltage terminal, a gate of the twelfth transistor is connected to the second node, a turn-on level is the first level;
   the third reconfiguration module comprises a thirteenth transistor; one of a source and a drain of the thirteenth transistor is connected to the scan pulse output and the other is connected to a DC voltage terminal, a gate of the thirteenth transistor is connected to the second clock signal input, a turn-on level thereof is the first level;
   the fourth reconfiguration module comprises a fourteenth transistor, one of a source and a drain of the fourteenth transistor is connected to the scan pulse output and the other is connected to a DC voltage terminal, a gate of the fourteenth transistor is connected to the third clock signal input, a turn-on level thereof is the first level; and
   the fifth reconfiguration module comprises a fifteenth transistor; one of a source and a drain of the fifteenth transistor is connected to the scan pulse output and the other is connected to the DC voltage terminal, a gate of the fifteenth transistor is connected to the fourth clock signal input, a turn-on level is the first level.

15. The shift register unit according to claim 2, wherein the first reset module comprises a sixteenth transistor; a gate of the sixteenth transistor is connected to the first reset control signal input, one of a source and a drain thereof is connected to the first node and the other is connected to the DC voltage terminal, a turn-on level thereof is the first level.

16. The shift register unit according to claim 1, wherein width of the first level within each clock period in the first clock signal, the second clock signal and the third clock signal is identical with width of the scan pulse; the first levels in the first clock signal, the second clock signal and the third clock signal have a same duty cycle; the first levels in respective clock signals do not overlap one another and do not overlap the scan pulse; the first levels in the first clock signal, the first levels in the second clock signal, and the first levels in the third clock signal are outputted successively; starting time of one of the first levels in the first clock signal coincides with ending time of the scan pulse.

17. A gate driving circuit, comprising a plurality of cascaded shift register units according to claim 1,
wherein in two adjacent stages shift register units of the plurality of cascaded shift register units, the scan pulse output of a previous stage shift register unit in the two adjacent stages shift register unit is connected to the scan pulse input of a subsequent stage shift register unit in the two adjacent stages shift register unit, the first reset control signal input of the previous stage shift register unit is connected to the scan pulse output of the subsequent stage shift register unit.

18. A display device, comprising a display panel and the gate driving circuit according to claim 17, the gate driving circuit being used for outputting a gate scan signal to the display panel.

19. A gate driving circuit, comprising a plurality of cascaded shift register units according to claim 2,
wherein in two adjacent stages shift register units of the plurality of cascaded shift register units, the scan pulse output of a previous stage shift register unit in the two adjacent stages shift register unit is connected to the scan pulse input of a subsequent stage shift register unit in the two adjacent stages shift register unit, the first reset control signal input of the previous stage shift register unit is connected to the scan pulse output of the subsequent stage shift register unit.

20. A method of driving a shift register unit, the shift register unit comprising an input module connected to a scan pulse input and a first node, an output module connected to a first clock signal input, the first node and a scan pulse output, a reset module connected to a first reset control signal input and the first node, and a control module connected to the first node, the first clock signal input, a second clock signal input, a third clock signal input and the reset module, the method comprising:
inputting a scan pulse at the scan pulse input, a voltage of the scan pulse being at a first level and the scan pulse input controlling a level of the first node based on the scan pulse;
inputting a first clock signal at the first clock signal input, inputting a second clock signal at the second clock signal input, inputting a third clock signal at the third clock signal input,
selectively setting the scan pulse output at a level of the first clock signal based on a level of the first node by the output module,
resetting the first node and the scan pulse output based on a level of the first reset control signal input by the reset module, and
generating, when the first node is at a second level, a reset trigger signal based on a relation among levels of the first clock signal, the second clock signal and the third clock signal by the control module;
wherein width of each of first levels within individual clock periods in the first clock signal, the second clock signal and the third clock signal is identical with width of the scan pulse; the first levels in the first clock signal, the second clock signal and the third clock signal have a same duty cycle; the first levels in respective clock signals do not overlap one another and do not overlap the scan pulse; the first levels in the first clock signal, the first levels in the second clock signal, and the first levels in the third clock signal are outputted successively; and starting time of one of the first levels in the first clock signal coincides with ending time of the scan pulse.

* * * * *